(12) United States Patent
Okubo et al.

(10) Patent No.: US 7,148,573 B2
(45) Date of Patent: Dec. 12, 2006

(54) SEMICONDUCTOR INTEGRATED CIRCUIT

(75) Inventors: Takuya Okubo, Shimane (JP); Masaru Sakai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 77 days.

(21) Appl. No.: 10/929,760

(22) Filed: Aug. 31, 2004

(65) Prior Publication Data
US 2005/0046013 A1  Mar. 3, 2005

(30) Foreign Application Priority Data
Sep. 2, 2003  (JP) .............................. 2003-309718

(51) Int. Cl.
*H01L 23/48* (2006.01)
(52) U.S. Cl. ...................... 257/758; 257/706; 257/712; 257/713
(58) Field of Classification Search ................ 257/706, 257/712, 713, 700, 701, 758, 704
See application file for complete search history.

(56) References Cited

U.S. PATENT DOCUMENTS 6,201,300 B1 * 3/2001 Tseng et al. ................ 257/706

FOREIGN PATENT DOCUMENTS

JP  07-321286  12/1995

* cited by examiner

*Primary Examiner*—Mai-Huong Tran
(74) *Attorney, Agent, or Firm*—Arent Fox PLLC

(57) ABSTRACT

A semiconductor integrated circuit comprises a semiconductor substrate, a heat-producing circuit element formed in a multi-layer structure on the semiconductor substrate and performing a predetermined operation while producing heat of a relatively high temperature, a plurality of temperature-dependent circuit elements, each formed in a multi-layer structure in a predetermined location on the semiconductor substrate, performing a predetermined operation depending on temperature of the heat-producing circuit element, and each having a constant relationship in temperature-related properties with each another, and a heat conductive layer having a heat conductivity higher than a heat conductivity of the semiconductor substrate, and covering at least a heat-producing portion of the heat-producing circuit element and the plurality of temperature-dependent circuit elements continuously so as to conduct the heat produced by the heat-producing circuit element to the plurality of temperature-dependent circuit elements. With this structure, the semiconductor integrated circuit can maintain its intended operating accuracy regardless of changes in temperature.

15 Claims, 5 Drawing Sheets

SEMICONDUCTOR INTEGRATED CIRCUIT

BACKGROUND OF THE INVENTION

This application is based on Japanese Patent Application No. 2003-309718 filed on Sep. 2, 2003, the contents of which are hereby incorporated by reference.

1. Field of the Invention

The present invention relates to a semiconductor integrated circuit comprising a heat-producing circuit element that produces relatively intense heat and performs a predetermined operation and a plurality of temperature-dependent circuit elements that show a constant relationship in properties with each another while performing a predetermined operation depending on temperature thereof.

2. Description of the Prior Art

For example, in audio equipment, since accuracy in reproduction of sounds deteriorates if an output voltage of a power supply circuit becomes unstable, a switching regulator, a DC/DC controller, or the like is used as the power supply circuit. This type of power supply circuit comprises a power transistor for producing a large output power and a control circuit including a plurality of transistors for controlling the power transistor. A semiconductor integrated circuit arranged in a single chip having the power transistor and the control circuit formed together therein is widely used.

FIG. 5 shows a layout of a power supply circuit formed by a conventional semiconductor integrated circuit. As shown in FIG. 5, the conventional semiconductor integrated circuit has, on a silicon wafer 1, a power transistor 2, a pair of transistors 3 and 4 forming a part of an overheating protection circuit to protect the power transistor 2 from overheating, and a pair of transistors 5 and 6 forming a part of a control circuit to regulate the power transistor 2.

The overheating protection circuit is configured so as to include a comparator for detecting a temperature produced from the power transistor 2. This comparator compares a reference voltage with an input voltage that fluctuates according to the temperature. The transistors 5 and 6 used for the control circuit form a current mirror circuit that performs a control for stabilizing the output voltage of the power transistor 2.

Now, in the semiconductor integrated circuit configured as described above, operating accuracy of the power transistor 2 may deteriorates when heat released therefrom is conducted to the transistors 3, 4, 5, and 6 by heat conduction, because the power transistor 2 produces relatively intense heat in comparison with other circuit elements.

Each of the pair of transistors 3 and 4 that forms the comparator has identical properties with each other. If distances of the transistors 3 and 4 from a heat producing source of the power transistor 2 are different from each other, then temperatures of the transistors 3 and 4 become different from each other. As a result, the properties of the transistors 3 and 4 will be different from each other, causing the aforementioned result.

Therefore, this presents an identical situation in which the transistors 3 and 4 having properties different from each other are used. Consequently, the accuracy of the comparator is decreased and the overheating protection circuit is prevented from serving its original function for protecting the power transistor 2 from overheating and the semiconductor integrated circuit may be destroyed by overheating.

Also, each of the pair of transistors 5 and 6 that forms the current mirror circuit has properties identical with each other. If distances of the transistors 5 and 6 from the heat producing source of the power transistor 2 are different from each other, then temperatures of the transistors 5 and 6 become different from each other. As a result, the properties of the transistors 5 and 6 will be different from each other.

Therefore, this presents an identical condition in which the transistors 5 and 6 having properties different from each other are used. Consequently, the current mirror circuit is prevented from serving its original function so that the accuracy of the control circuit for controlling the power transistor 2 decreases. As a result, the output voltage of the power transistor 2 becomes unstable, leading to, for example, deterioration in the audio reproduction accuracy of the audio equipment.

In a semiconductor integrated circuit incorporating a power transistor that produces a great amount of heat as described above, a comparator that requires high accuracy therein is influenced by the heat in its operation. One of the reasons for this is a distance to the power transistor in the layout of the semiconductor integrated circuit or a thermal conductivity of the material used for the semiconductor integrated circuit. Therefore, in a semiconductor integrated circuit, an offset voltage is generated by a shift in a threshold voltage caused when the uniform operation of the comparator or the like varies due to heat. Because of this reason, the semiconductor integrated circuit should be designed with due attention paid to the layout therein.

In order to solve the aforementioned deficiencies, according to a conventional technology described in the Japanese Patent Registered No. 3400098, each temperature-dependent element is laid by determining its distance and/or direction relative to a heat source element so that two or more temperature-dependent elements maintain a constant relationship in properties even when temperatures of the two or more temperature-dependent elements vary. As a result, the two or more temperature-dependent elements maintain a constant relationship with each another in properties regardless of heat produced by the heat source element.

However, it is possible that the intended accuracy in operation will suffer because the constant relationship in properties among the two or more temperature-dependent elements is not necessarily maintained due to changes of environmental factors. In addition, attempting to solve the deficiencies, by contrast, imposes a restriction on the layout design of the circuit elements.

SUMMARY OF THE INVENTION

It is a general object of the present invention to provide a semiconductor integrated circuit that solves aforementioned problems. It is a more specific object of the present invention to provide a semiconductor integrated circuit capable of maintaining the designed accuracy in operation without restricting a layout of circuit elements laid therein even when properties of temperature-dependent circuit elements vary depending on temperatures in a circuit having heat-producing circuit elements and the temperature-dependent circuit elements mixed together.

To achieve the above object, according to one aspect of the present invention, a semiconductor integrated circuit comprises a semiconductor substrate, a heat-producing circuit element formed in a multi-layer structure on the semiconductor substrate and performing a predetermined operation while producing heat of a relatively high temperature, a plurality of temperature-dependent circuit elements, each formed in a multi-layer structure in a predetermined location on the semiconductor substrate, performing a predetermined operation depending on temperature of the heat-producing circuit element, and each having a constant relationship in temperature-related properties with each another, and a heat conductive layer having a heat conductivity higher than a heat conductivity of the semiconductor substrate, and covering at least a heat-producing portion of the heat-producing circuit element and the plurality of temperature-dependent circuit elements continuously so as to conduct the heat produced by the heat-producing circuit element to the plurality of temperature-dependent circuit elements.

With this structure, since the heat-producing circuit element and the temperature-dependent circuit elements are covered with a layer of a material having a conductivity higher than a conductivity of the semiconductor substrate, heat produced by the heat-producing is conducted to the temperature-dependent circuit elements efficiently and quickly. For this reason, if, for example, the temperature-dependent circuit elements are purposed for protecting the heat-producing circuit element from overheating, the temperature-dependent circuit elements can detect the overheating temperature of the heat-producing circuit element quickly and accurately so as to protect the heat-producing circuit element from overheating, resulting in enhancing the reliability of the semiconductor integrated circuit with respect to the protection against overheating.

According to still another aspect of the present invention, a semiconductor integrated circuit comprises a semiconductor substrate, a heat-producing circuit element formed in a multi-layer structure on the semiconductor substrate and performing a predetermined operation while producing heat of a relatively high temperature, a plurality of temperature-dependent circuit elements, each formed in a multi-layer structure in a predetermined location on the semiconductor, substrate and maintaining a constant relationship in temperature-related properties with each another while performing a predetermined operation, and a heat conductive layer having a heat conductivity higher than a heat conductivity of the semiconductor substrate, and covering the plurality of temperature-dependent circuit elements continuously so as to conduct and distribute temperature of each of the plurality of temperature-dependent circuit elements to each of the plurality of temperature-dependent circuit elements evenly.

With this structure, since the temperature-dependent circuit elements are covered with a layer of a material having a conductivity higher than a conductivity of the semiconductor substrate, heat is evenly conducted and distributed among the temperature-dependent circuit elements. Accordingly, a constant relationship in properties of the temperature-dependent circuit elements is maintained. This makes it possible to reduce variations in operation which will otherwise be caused by heat. As a result, it is possible to maintain the intended accuracy in operation regardless of changes in temperature.

According to still another aspect of the present invention, a semiconductor integrated circuit comprises a semiconductor substrate, a heat-producing circuit element formed in a multi-layer structure on the semiconductor substrate and performing a predetermined operation while producing heat of a relatively high temperature, a plurality of first temperature-dependent circuit elements, each formed in a multi-layer structure in a predetermined location on the semiconductor substrate, performing a predetermined operation depending on temperature of the heat-producing circuit element, and each having a constant relationship in temperature-related properties with each another, a plurality of second temperature-dependent circuit elements, each formed in a multi-layer structure in a predetermined location on the semiconductor substrate and maintaining a constant relationship in temperature-related properties with each another while performing a predetermined operation, a first heat conductive layer having a heat conductivity higher than a heat conductivity of the semiconductor substrate, and covering at least a heat-producing portion of the heat-producing circuit element and the plurality of first temperature-dependent circuit elements continuously so as to conduct the heat produced by the heat-producing circuit element to the plurality of first temperature-dependent circuit elements, and a second heat conductive layer having a heat conductivity higher than the heat conductivity of the semiconductor substrate, and covering the plurality of second temperature-dependent circuit elements continuously so as to conduct and distribute temperature of each of the plurality of second temperature-dependent circuit elements to each of the plurality of second temperature-dependent circuit elements evenly.

With this structure, heat released by the heat-producing circuit element is conducted to the first temperature-dependent circuit elements efficiently and quickly. For this reason, if, for example, the first temperature-dependent circuit elements are purposed for protecting the heat-producing circuit element from overheating, the first temperature-dependent circuit elements can detect the overheating temperature of the heat-producing circuit element quickly and accurately so as to protect the heat-producing circuit element from overheating, resulting in enhancing the reliability of the semiconductor integrated circuit with respect to the protection against overheating. Also, with this structure, heat is evenly conducted and distributed among the second temperature-dependent circuit elements. Accordingly, a constant relationship in properties of the second temperature-dependent circuit elements is maintained. This makes it possible to reduce variations in operation which will otherwise be caused by heat. As a result, it is possible to maintain the intended accuracy in operation regardless of changes in temperature.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENT

Figure 1:
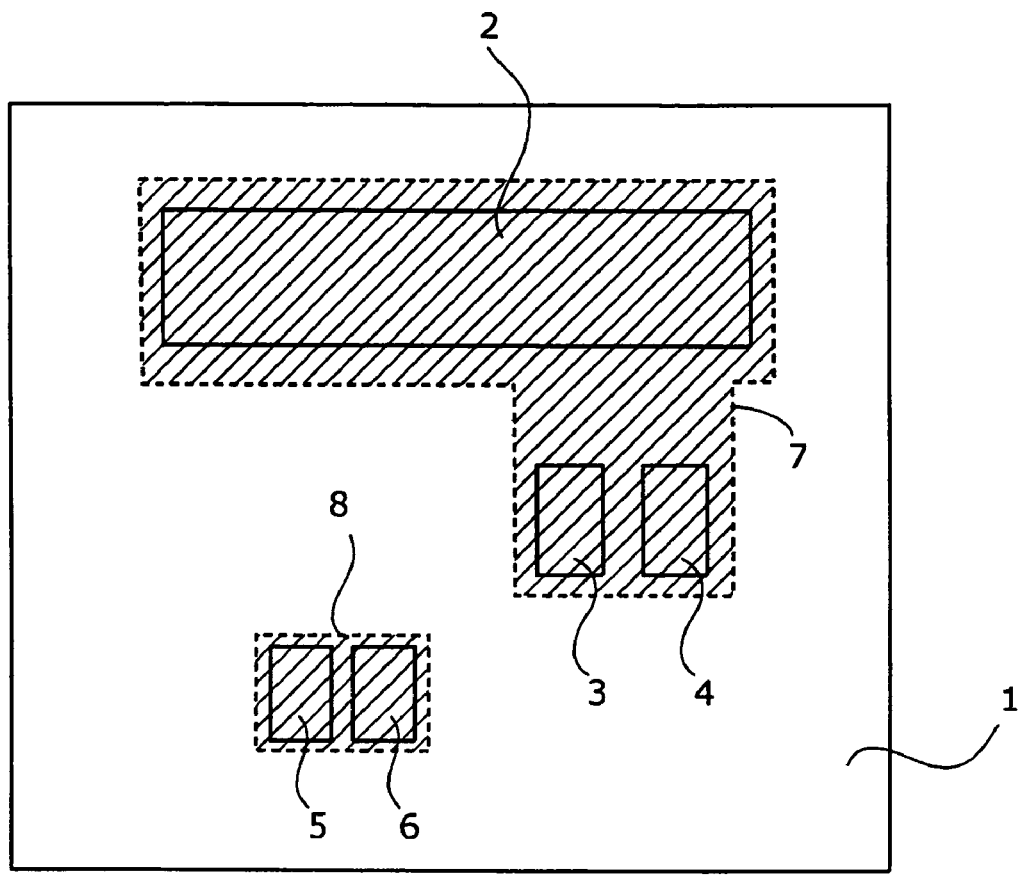
FIG. 1 is a diagram showing a first example of a circuit layout of a semiconductor integrated circuit embodying the present invention.

Hereinafter, an embodiment of the present invention will be described with reference to the accompanying drawings. FIG. 1 is a diagram showing a first example of a circuit layout of a semiconductor integrated circuit embodying the present invention. This semiconductor integrated circuit is provided with, on a silicon wafer 1, a power transistor 2, a pair of transistors 3 and 4 that form a part of an overheating protection circuit for protecting the power transistor 2 from overheating, and a pair of transistors 5 and 6 that form a part of a control circuit for controlling the power transistor 2.

The overheating protection circuit is so configured as to include a comparator for detecting an overheating temperature. The comparator compares a reference voltage with an input voltage that changes when the properties of the temperature-dependent circuit elements such as the pair of transistors 3 and 4 change according to the temperature, and outputs a resulting voltage. The control circuit comprises the pair of transistors 5 and 6 that form a current mirrors circuit for controlling the power transistor 2 so as to stabilize an output voltage thereof. The power transistor 2 and the pair of transistors 3 and 4 are covered with a gold layer 7. Furthermore, the pair of transistors 5 and 6 are covered with a gold layer 8.

The heat conductivity of gold is higher than that of silicon which forms a passage for heat conduction. Consequently, heat produced by the power transistor 2 is conducted to the transistors 3 and 4 efficiently. By this arrangement, the overheating protection circuit including and comprising the transistors 3 and 4 can detect an overheating temperature of the power transistor 2 accurately and rapidly so as to protect the power transistor 2 from overheating, thereby resulting in an enhanced reliability of the semiconductor integrated circuit with respect to the overheating protection.

Now, since the transistors 5 and 6 form the control circuit that is different from a circuit for protecting against overheating by detecting the temperature of the power transistor 2, it is not necessary to quickly and accurately transfer the heat from the power transistor 2 as achieved by using the gold layer 7. In this case, an accurate control is made possible as long as the relationship between the transistors 5 and 6 is kept constant with respect to the temperatures thereof. For this reason, the transistors 5 and 6 are covered with the gold layer 8. By this arrangement, heat is evenly conducted to and divided between the transistors 5 and 6. This makes it possible to maintain the constant relationship in properties between the transistors 5 and 6, and prevent variations in the operation from being caused by varying temperatures. Therefore, the semiconductor integrated circuit can maintain its designed accuracy in operation regardless of temperature changes caused by the power transistor 2, contributing to enhancing the overall accuracy of the semiconductor integrated circuit.

Although the example is described by taking up the transistors 5 and 6 as a pair of transistors that form the current mirror circuit, the present invention is also applicable to two or more temperature-dependent circuit elements that form a circuit in which high operating accuracy is required and a constant relationship in temperature-related properties among the elements should be maintained. In the example, although only the power transistor 2, the transistors 3 and 4, and the transistors 5 and 6 are shown, actually, a plurality of other circuit elements are also laid on the silicon wafer 1. Furthermore, the layout design of the circuit elements on the silicon wafer 1 is not specifically limited to the one shown in FIG. 1.

A temperature difference $\Delta T$ when an amount of heat Q (W) is conducting through a material having a heat conductivity $\lambda$ (W/m·k) can be obtained by a following formula.

$$T = T_1 - T_2 = (Q/\lambda) \cdot (L/S) \text{ (° C.)}$$

Here, S is a cross-sectional area ($m^2$) of the heat conducting material and L is a distance (m) through which the heat is conducted. It can be understood from this formula that, in order to make the temperature difference $\Delta T$ smaller, that is, to transfer the heat quickly, it is necessary to use a material having a higher heat conductivity $\lambda$. In the case of silicon, the heat conductivity $\lambda$ is 157 W/m·k, and in the case of gold, the heat conductivity $\lambda$ is 319 W/m·k. This means that, because the heat conductivity of gold is about twice that of silicon, an increase in stability against varying temperature in the semiconductor integrated circuit of the embodiment is expected to be about twice.

Figure 2:
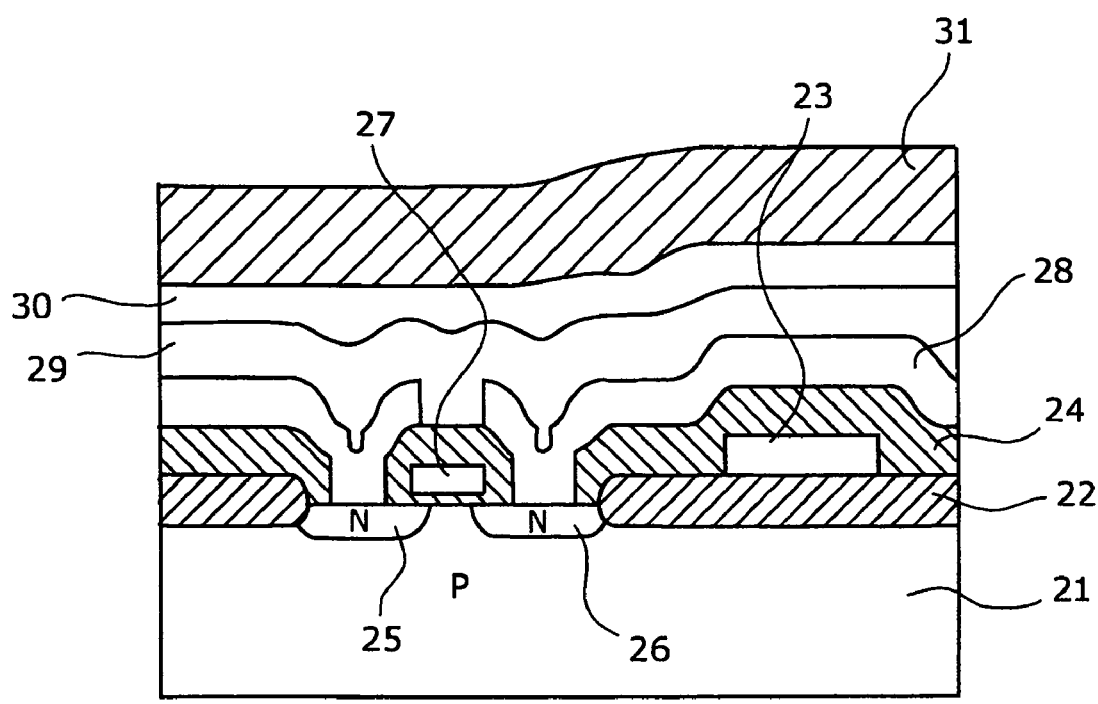
FIG. 2 is a cross sectional view of an N-channel MOS transistor included in the semiconductor integrated circuit of the embodiment.

FIG. 2 is a cross sectional view of an N-channel MOS transistor included in the semiconductor integrated circuit of the embodiment. In FIG. 2, reference numeral 21 represents a P-type silicon wafer (substrate); reference numeral 22 represents a field oxide layer; reference numeral 23 represents oxide polysilicon; reference numeral 24 represents an interlayer dielectric layer; reference numeral 25 represents a source; reference numeral 26 represents a drain; reference numeral 27 represents a gate; reference numeral 28 represents an aluminum electrode; reference numeral 29 represents an interlayer dielectric layer made of silicon dioxide; reference numeral 30 represents a plasma nitride layer serving also as a protection and insulation layer; and reference numeral 31 represents a gold layer for increasing the heat conductivity.

In this embodiment, a major feature of the N-channel MOS transistor formed as a semiconductor integrated circuit is that a gold layer is laid on a top surface of the plasma nitride layer 30, this is, on top of a surface of the uppermost protection and insulation layer. In addition to the heat conducted through the silicon wafer 21, the heat is also conducted through the gold layer 31 laid as the uppermost layer and having a high heat conductivity. Therefore, it is possible to conduct the heat quickly and uniformly. It is also possible to protect and, at the same time, reinforce the semiconductor integrated circuit.

Figure 3:
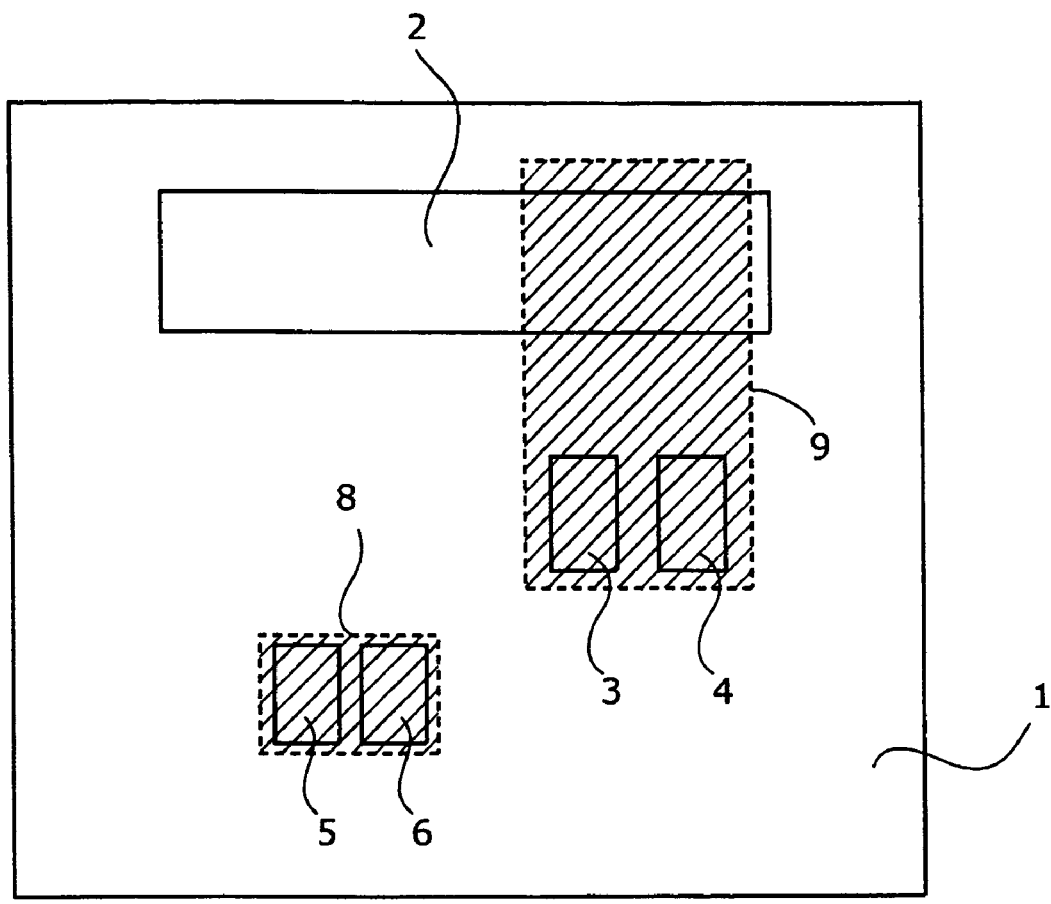
FIG. 3 is a diagram showing a second example of a circuit layout of the semiconductor integrated circuit embodying the present invention.

FIG. 3 is a diagram showing a second example of a circuit layout of the semiconductor integrated circuit embodying the present invention. This semiconductor integrated circuit is provided with, on a silicon wafer 1, a power transistor 2, a pair of transistors 3 and 4 that form a part of an overheating protection circuit for protecting the power transistor 2 from overheating, and a pair of transistors 5 and 6 that form a part of a control circuit for controlling the power transistor 2.

The overheating protection circuit is so configured as to include a comparator for detecting an overheating temperature. The comparator compares a reference voltage with an input voltage that changes when the properties of the temperature-dependent circuit elements such as the pair of transistors 3 and 4 change according to the temperature, and outputs a resulting voltage. The control circuit comprises the pair of transistors 5 and 6 that form a current mirror circuit for controlling the power transistor 2 so as to stabilize an output voltage thereof. The power transistor 2 and the pair of transistors 3 and 4 are covered with a gold layer 9. Furthermore, the pair of transistors 5 and 6 are covered with a gold layer 8.

Shown in this example is a case in which a heat producing portion of the power transistor 2 is concentrated on the right side viewed in FIG. 3 and the gold layer 9 is laid so as to cover the corresponding portion on the right side of the power transistor 2. As indicated, it is not necessary to cover the power transistor 2 in its entirety if the heat is produced at a specific portion of a heat-producing circuit element. In this example, therefore, it is possible to obtain a similar result as the first example shown in FIG. 1 and reduce an area of the gold layer 9, leading to saving gold.

Figure 4:
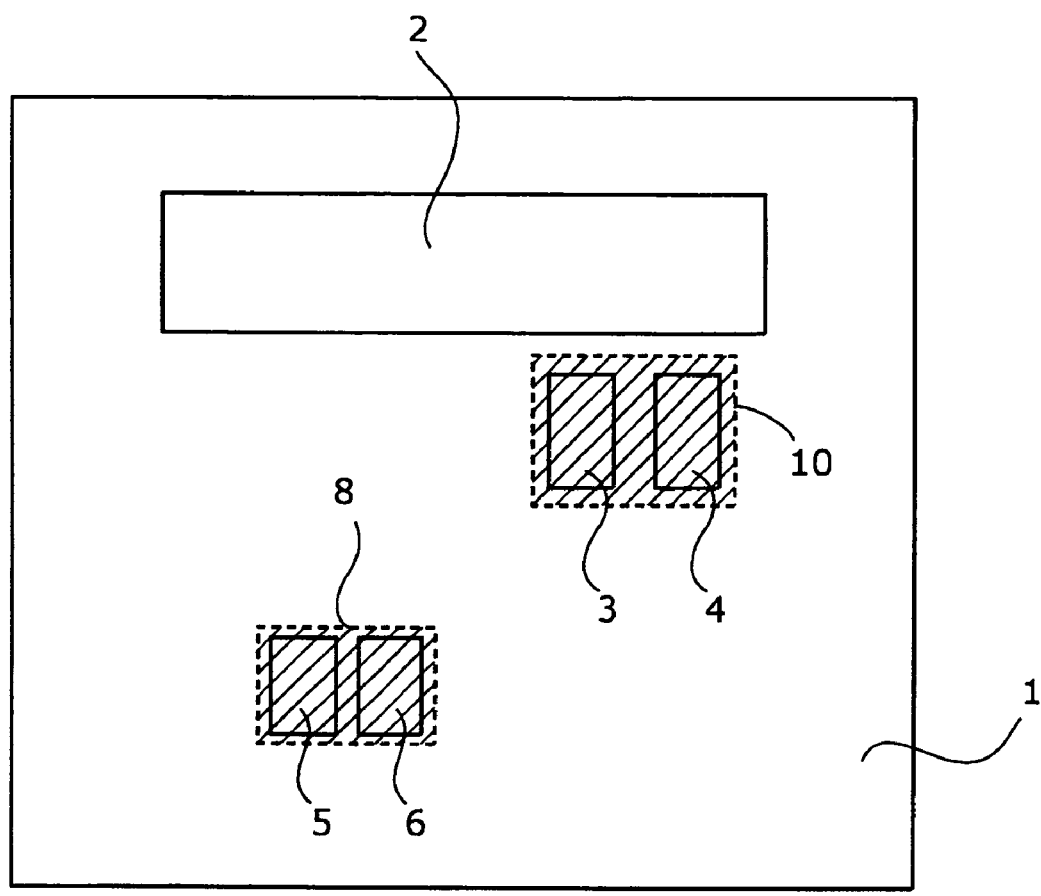
FIG. 4 is a diagram showing a third example of a circuit layout of the semiconductor integrated circuit embodying the present invention.
Figure 5:
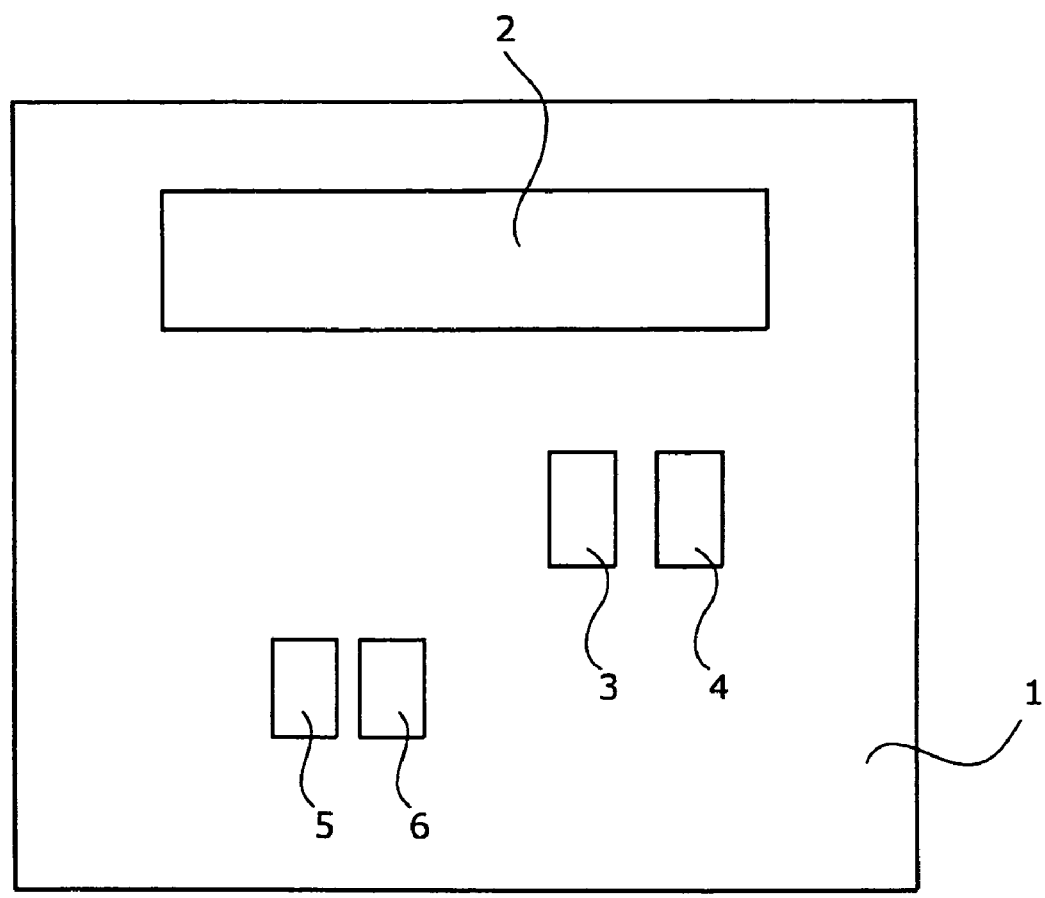
FIG. 5 is a diagram showing a layout of a power supply circuit in a conventional semiconductor integrated circuit.

FIG. 4 is a diagram showing a third example of a circuit layout of the semiconductor integrated circuit embodying the present invention. This semiconductor integrated circuit is provided with, on a silicon wafer 1, a power transistor 2, a pair of transistors 3 and 4 that form a part of an overheating protection circuit for protecting the power transistor 2 from overheating, and a pair of transistors 5 and 6 that form a part of a control circuit for controlling the power transistor 2.

The overheating protection circuit is so configured as to include a comparator for detecting an overheating temperature. The comparator compares a reference voltage with an input voltage that changes when the properties of the temperature-dependent circuit elements such as the pair of transistors 3 and 4 change according to the temperature, and outputs a resulting voltage. The control circuit comprises the pair of transistors 5 and 6 that form a current mirror circuit for controlling the power transistor 2 so as to stabilize an output voltage thereof. The power transistor 2 and the pair of transistors 3 and 4 are covered with a gold layer 10. Furthermore, the pair of transistors 5 and 6 are covered with a gold layer 8.

According to this example, the pair of transistors 3 and 4 are located closer to the power transistor 2 than the transistors 3 and 4 shown in the first and second examples. In this layout, the heat is sufficiently conducted from the power transistor 2 without using the gold layer. However, the operation accuracy deteriorates if there is a variation between temperatures of the transistors 3 and 4. For this reason, the gold layer 10 does not cover the power transistor 2 but covers the transistors 3 and 4. By covering the transistors 3 and 4 with the gold layer 10, the heat is evenly distributed between the transistors 3 and 4.

If the transistors 3 and 4 are not the ones that do not operate by detecting the temperature of the power transistor 2 as described in the first and second examples and a constant relationship in temperature-related properties between the transistors 3 and 4 shall be maintained, as applied to the transistors 5 and 6, the gold layer 10 can be arranged to cover the transistors 3 and 4 alone without covering the power transistor 2 so that the heat is evenly distributed between the transistors 3 and 4. As a result of this arrangement, a constant relationship in properties between the transistors 3 and 4 is maintained so that variations in operation caused by heat can be prevented. Consequently, the semiconductor integrated circuit can maintain its designed accuracy in operation regardless of changes in temperature, contributing to enhancing the overall accuracy in operation. Since the pair of transistors 5 and 6 are also covered with the gold layer 8, a similar effect can be achieved.

All of the examples described above dealt with the gold layer specifically designed to cover the circuit elements. However, not limiting to the gold layer, it is also possible to electrically isolate and use a part of a wiring layer that is used to connect the circuit elements instead of the aforementioned gold layer if doing so does not hinder the connections. In this case, if the wiring layer is not formed as the uppermost layer, a degree of protecting and reinforcing the semiconductor integrated circuit may be slightly decreased. However, since this method contributes to saving the aforementioned gold and does not require an additional gold layer, it is possible to simplify the structure of the semiconductor integrated circuit and produce it at low cost. It is also possible to use, instead of gold, other materials such as silver, aluminum, cupper, and tungsten which have a higher heat conductivity than that of silicon and are less expensive than gold. In this case, the semiconductor integrated circuit can be produced at low cost.

The gold layer that covers such a heat-producing circuit element as the power transistor 2 shall cover at least a heat-producing portion of the heat-producing circuit element. When the gold layer covers such temperature-dependent circuit elements that form a pair such as the transistors 3 and 4, and transistors 5 and 6, the elements in the pair should receive sufficient heat under the same condition. For this reason, at least the elements in the pair should be covered with the continuous gold layer and at least all portions forming each of the elements should be fully covered with the gold layer. It is also to be noted that the gold layer or a layer made of another material for conducting heat is not electrically connected to the circuit elements so as to avoid adverse effect caused by the heat on the electrically connected portions.

Obviously, many modifications and variations of the present invention are possible in light of the above teachings. It is therefore to be understood that the present invention is not limited to the embodiments as described above and that within the scope of the appended claims, the invention may be practiced other than as specifically described.

What is claimed is:

1. A semiconductor integrated circuit comprising:
   a semiconductor substrate;
   a heat-producing circuit element formed in a multi-layer structure on the semiconductor substrate and performing a predetermined operation while producing heat of a relatively high temperature;
   a plurality of temperature-dependent circuit elements, each formed in a multi-layer structure in a predetermined location on the semiconductor substrate, performing a predetermined operation depending on temperature of the heat-producing circuit element, and each having a constant relationship in temperature-related properties with each another; and
   a heat conductive layer having a heat conductivity higher than a heat conductivity of the semiconductor substrate, and covering at least a heat-producing portion of the heat-producing circuit element and the plurality of temperature-dependent circuit elements continuously so as to conduct the heat produced by the heat-producing circuit element to the plurality of temperature-dependent circuit elements.

2. A semiconductor integrated circuit as claimed in claim 1,
   wherein the heat-producing circuit element is a power transistor, and
   the plurality of temperature-dependent circuit elements are transistors forming an overheating protection circuit for protecting the power transistor from overheating by detecting temperature conditions thereof.

3. A semiconductor integrated circuit as claimed in claim 2,
   wherein the overheating protection circuit comprises a comparator receiving a voltage varying according to the temperature conditions of the power transistor as one input and a reference voltage as other input.

4. A semiconductor integrated circuit as claimed in claim 1,
   wherein the heat conductive layer is a gold layer formed as an uppermost layer in the multi-layer structure.

5. A semiconductor integrated circuit as claimed in claim 1, wherein the heat conductive layer is a part of a wiring layer formed to connect circuit elements that are formed in the semiconductor integrated circuit.

6. A semiconductor integrated circuit comprising:

a semiconductor substrate;

a heat-producing circuit element formed in a multi-layer structure on the semiconductor substrate and performing a predetermined operation while producing heat of a relatively high temperature;

a plurality of temperature-dependent circuit elements, each formed in a multi-layer structure in a predetermined location on the semiconductor substrate and maintaining a constant relationship in temperature-related properties with each another while performing a predetermined operation; and a heat conductive layer having a heat conductivity higher than a heat conductivity of the semiconductor substrate, and covering the plurality of temperature-dependent circuit elements continuously so as to conduct and distribute temperature of each of the plurality of temperature-dependent circuit elements to each of the plurality of temperature-dependent circuit elements evenly.

7. A semiconductor integrated circuit as claimed in claim 6, wherein the heat-producing circuit element is a power transistor, and the plurality of temperature-dependent circuit elements are transistors forming a control circuit for performing a control so as to stabilize an output voltage of the power transistor.

8. A semiconductor integrated circuit as claimed in claim 7, wherein the control circuit comprises a current mirror circuit.

9. A semiconductor integrated circuit as claimed in claim 6, wherein the heat conductive layer is a gold layer formed as an uppermost layer in the multi-layer structure.

10. A semiconductor integrated circuit as claimed in claim 6, wherein the heat conductive layer is a part of a wiring layer formed to connect circuit elements that are formed in the semiconductor integrated circuit.

11. A semiconductor integrated circuit comprising:

a semiconductor substrate;

a heat-producing circuit element formed in a multi-layer structure on the semiconductor substrate and performing a predetermined operation while producing heat of a relatively high temperature;

a plurality of first temperature-dependent circuit elements, each formed in a multi-layer structure in a predetermined location on the semiconductor substrate, performing a predetermined operation depending on temperature of the heat-producing circuit element, and each having a constant relationship in temperature-related properties with each another;

a plurality of second temperature-dependent circuit elements, each formed in a multi-layer structure in a predetermined location on the semiconductor substrate and maintaining a constant relationship in temperature-related properties with each another while performing a predetermined operation;

a first heat conductive layer having a heat conductivity higher than a heat conductivity of the semiconductor substrate, and covering at least a heat-producing portion of the heat-producing circuit element and the plurality of first temperature-dependent circuit elements continuously so as to conduct the heat produced by the heat-producing circuit element to the plurality of first temperature-dependent circuit elements; and a second heat conductive layer having a heat conductivity higher than the heat conductivity of the semiconductor substrate, and covering the plurality of second temperature-dependent circuit elements continuously so as to conduct and distribute temperature of each of the plurality of second temperature-dependent circuit elements to each of the plurality of second temperature-dependent circuit elements evenly.

12. A semiconductor integrated circuit as claimed in claim 11, wherein the heat-producing circuit element is a power transistor, the plurality of first temperature-dependent circuit elements are transistors forming an overheating protection circuit for protecting the power transistor from overheating by detecting temperature conditions of the power transistor, and the plurality of second temperature-dependent circuit elements are transistors forming a control circuit for performing a control so as to stabilize an output voltage of the power transistor.

13. A semiconductor integrated circuit as claimed in claim 12, wherein the overheating protection circuit comprises a comparator receiving a voltage varying according to the temperature conditions of the power transistor as one input and a reference voltage as other input, and the control circuit comprises a current mirror circuit.

14. A semiconductor integrated circuit as claimed in claim 11, wherein the first heat conductive layer and the second heat conductive layer are a gold layer formed as an uppermost layer in the multi-layer structure.

15. A semiconductor integrated circuit as claimed in claim 11, wherein the first heat conductive layer and the second heat conductive layer are a part of a wiring layer formed to connect circuit elements that are formed in the semiconductor integrated circuit.

* * * * *